United States Patent
Li et al.

(10) Patent No.: US 9,691,855 B2
(45) Date of Patent: Jun. 27, 2017

(54) METHOD OF GROWING A HIGH QUALITY III-V COMPOUND LAYER ON A SILICON SUBSTRATE

(75) Inventors: Zhen-Yu Li, Zhuqi Township, Chiayi County (TW); Hsing-Kuo Hsia, Jhubei (TW); Hao-Chung Kuo, Tsu-Bai (TW)

(73) Assignee: Epistar Corporation, Hsinchu (TW)

( * ) Notice: Subject to any disclaimer, the term of this patent is extended or adjusted under 35 U.S.C. 154(b) by 252 days.

(21) Appl. No.: 13/398,954

(22) Filed: Feb. 17, 2012

(65) Prior Publication Data
US 2013/0214281 A1 Aug. 22, 2013

(51) Int. Cl.
| | |
|---|---|
| *H01L 33/00* | (2010.01) |
| *H01L 29/10* | (2006.01) |
| *H01L 29/20* | (2006.01) |
| *H01L 21/02* | (2006.01) |
| *H01L 29/778* | (2006.01) |
| *H01L 33/12* | (2010.01) |

(52) U.S. Cl.
CPC ...... *H01L 29/1075* (2013.01); *H01L 21/0254* (2013.01); *H01L 21/02381* (2013.01); *H01L 21/02458* (2013.01); *H01L 21/02505* (2013.01); *H01L 29/20* (2013.01); *H01L 29/2003* (2013.01); *H01L 29/7787* (2013.01); *H01L 33/007* (2013.01); *H01L 33/12* (2013.01)

(58) Field of Classification Search
CPC ................. H01L 29/20; H01L 33/12
USPC .... 257/76, 101, 185, 191, E33.023, E33.031
See application file for complete search history.

(56) References Cited

U.S. PATENT DOCUMENTS

| | | | |
|---|---|---|---|
| 2010/0123139 A1* | 5/2010 | Sato | 257/76 |
| 2010/0244096 A1* | 9/2010 | Sato | 257/190 |
| 2012/0138949 A1* | 6/2012 | Nam et al. | 257/76 |
| 2012/0211759 A1* | 8/2012 | Liu et al. | 257/76 |
| 2013/0200495 A1* | 8/2013 | Keller et al. | 257/615 |

FOREIGN PATENT DOCUMENTS

| | | |
|---|---|---|
| EP | 2525417 A2 | 11/2012 |
| JP | 2007-221001 A | 8/2007 |

* cited by examiner

*Primary Examiner* — Robert Huber
(74) *Attorney, Agent, or Firm* — Muncy, Geissler, Olds & Lowe, P.C.

(57) ABSTRACT

The present disclosure involves a method of fabricating a semiconductor device. A surface of a silicon wafer is cleaned. A first buffer layer is then epitaxially grown on the silicon wafer. The first buffer layer contains an aluminum nitride (AlN) material. A second buffer layer is then epitaxially grown on the first buffer layer. The second buffer layer includes a plurality of aluminum gallium nitride ($Al_xGa_{1-x}$ N) sub-layers. Each of the sub-layers has a respective value for x that is between 0 and 1. A value of x for each sub-layer is a function of its position within the second buffer layer. A first gallium nitride (GaN) layer is epitaxially grown over the second buffer layer. A third buffer layer is then epitaxially grown over the first GaN layer. A second GaN layer is then epitaxially grown over the third buffer layer.

16 Claims, 7 Drawing Sheets

METHOD OF GROWING A HIGH QUALITY III-V COMPOUND LAYER ON A SILICON SUBSTRATE

TECHNICAL FIELD

The present disclosure relates generally to semiconductor fabrication, and more particularly, to growing a high quality III-V compound layer over a silicon substrate.

BACKGROUND

The semiconductor integrated circuit (IC) industry has experienced rapid growth in recent years. Technological advances in IC materials and design have produced various types of ICs that serve different purposes. The fabrication of some types of ICs may require forming a III-V compound layer on a substrate, for example forming a gallium nitride layer on a substrate. These types of IC devices may include, as examples, light-emitting diode (LED) devices, radio frequency (RF) devices, high electron mobility transistor (HEMT) devices, and high power semiconductor devices.

Traditionally, manufacturers have formed the III-V compound layer on a sapphire substrate. However, sapphire substrates are expensive. Thus, some manufacturers have been attempting to form III-V compound layers on a silicon substrate, which is cheaper. However, due to lattice constant mismatches between the III-V compound layer and the silicon substrate, existing methods of forming a III-V compound layer on a silicon substrate may result in wafer defects (e.g., cracking defects) or yield low quality III-V compound layers.

Therefore, while existing methods of forming III-V compound layers on silicon substrates have been generally adequate for their intended purposes, they have not been entirely satisfactory in every aspect. A method of growing high quality III-V compound layers on a silicon layer without defects such as cracking continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

As semiconductor fabrication technologies continue to advance, III-V compound materials have been utilized to produce a variety of devices, such as light-emitting diode (LED) devices, radio frequency (RF) devices, high electron mobility transistor (HEMT) devices, and high power semiconductor devices. A III-V compound material includes a compound that contains an element from a "III" group (or family) of the periodic table, and another element from a "V" group (or family) of the periodic table. For example, the III group elements may include Boron, Aluminum, Gallium, Iridium, and Titanium, and the V group elements may include Nitrogen, Phosphorous, Arsenic, Antimony, and Bismuth.

Traditionally, III-V compound materials have been grown on sapphire substrates. However, sapphire substrates are expensive. In comparison, silicon substrates are cheaper and have been used as the substrate on which semiconductor devices are formed for many years. Hence, it is desirable to use silicon substrates as the substrates for growing III-V compound materials. Unfortunately, a significant lattice mismatch exists between a III-V compound materials and a silicon substrate. Due at least in part to the lattice mismatch, stress or strain will result between the silicon substrate and a III-V compound layer formed thereon. Such stress or strain can lead to difficulty of growth of the III-V compound layer and/or cracks during fabrication. Some existing methods attempt to resolve these issues have either not been able to adequately prevent the defects such as cracks, and/or may lead to a degradation of the quality of the III-V compound material that is grown on the silicon substrate.

According to various aspects of the present disclosure, described below is a method of forming a high quality III-V compound layer on a silicon substrate with substantial defect reduction.

Figure 1:
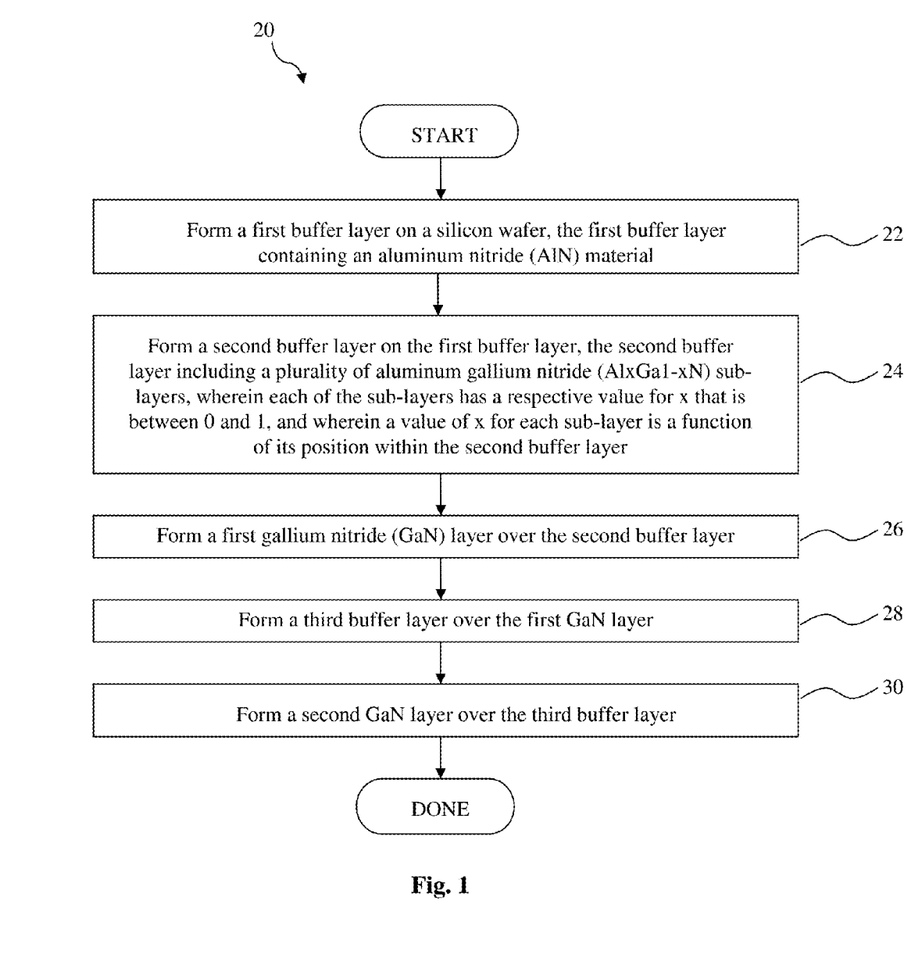
FIG. 1 is a flowchart illustrating a method of growing a high quality III-V compound layer according to various aspects of the present disclosure.

Illustrated in FIG. 1 is a flowchart of a method 20 for fabricating a semiconductor device according to various aspects of the present disclosure. Referring to FIG. 1, the method 20 begins with block 22, in which a first buffer layer is formed on a silicon wafer. The first buffer layer contains an aluminum nitride (AlN) material. The method 20 continues with block 24, in which a second buffer layer is formed on the first buffer layer. The second buffer layer includes a plurality of aluminum gallium nitride ($Al_x Ga_{1-x}N$) sub-layers. Each of the sub-layers has a respective value for x that is between 0 and 1. A value of x for each sub-layer is a function of its position within the second buffer layer. The method 20 continues with block 26, in which a first gallium nitride (GaN) layer is formed over the second buffer layer. The method 20 continues with block 28, in which a third buffer layer is formed over the first GaN layer. The method 20 continues with block 30, in which a second GaN layer is formed over the third buffer layer.

FIGS. 2 to 5 are diagrammatic fragmentary cross-sectional side views of a portion of a semiconductor wafer at various fabrication stages. It is understood that FIGS. 2 to 5 have been simplified for a better understanding of the inventive concepts of the present disclosure. Accordingly, it should be noted that additional processes may be provided before, during, and after the method illustrated in FIGS. 2-5, and that some other processes may only be briefly described herein.

Figure 2:
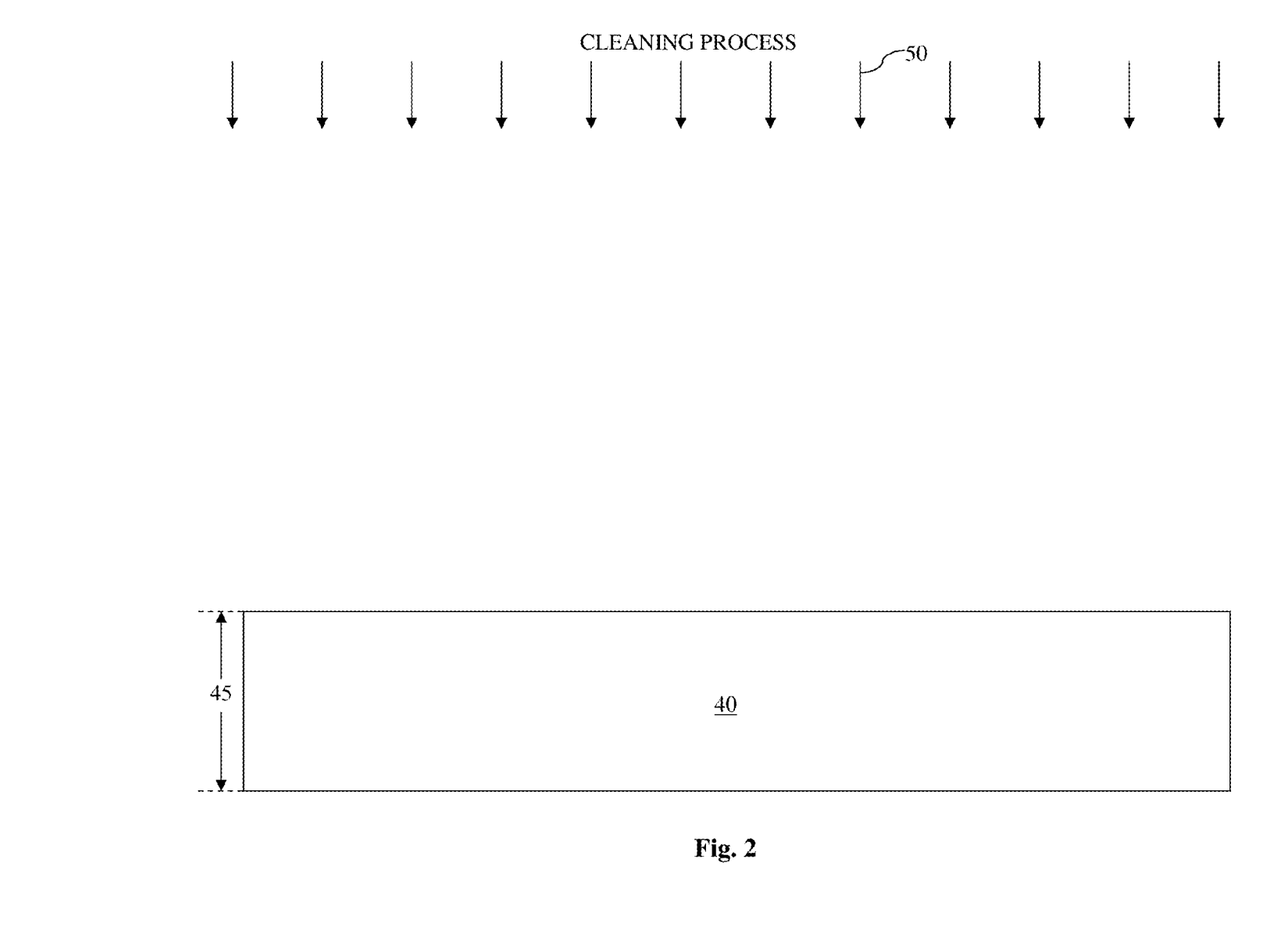
FIGS. 2-5 are diagrammatic fragmentary cross cross-sectional side views of a wafer at various stages of fabrication according to various aspects of the present disclosure.

Referring to FIG. 2, a silicon wafer 40 is provided. The silicon wafer 40 may also be referred to as a silicon substrate 40. The silicon wafer 40 has a thickness 45. In some embodiments, the thickness 45 is in a range from about 280 microns (um) to about 1200 um. In some embodiments, the thickness 45 is in a range from about 500 um to about 1000 um. In some embodiments, the surfaces of the silicon wafer 40 may be silicon (111) surfaces. The silicon (111) surface is obtained by cleaving or cutting the silicon along a (111) lattice plane defined according to a Miller Index. The silicon wafer 40 is chosen to have the silicon (111) surface in certain embodiments because the silicon (111) surface has a relatively small mismatch with a buffer layer to be formed on the silicon (111) surface. Had a different silicon surface been used, such as a silicon (100) surface, the mismatch between the silicon (100) surface and the buffer layer would have been greater and consequently would have led to more fabrication difficulties.

Before any epitaxial growth processes take place on the silicon wafer 40, a cleaning process 50 is performed to the silicon wafer 40. The cleaning process 50 may involve two steps. First, the silicon wafer 40 is boiled in a first chemical solution. In some embodiments, the first chemical solution may contain a mixture of sulfuric acid ($H_2SO_4$) and hydrogen peroxide ($H_2O_2$), where a mixing ratio of $H_2SO_4:H_2O_2$ is about 3:1. The silicon wafer 40 may be boiled for a time period from about 10 minutes to about 20 minutes. This step of the cleaning process 50 removes contaminants from the surface of the silicon wafer 40 and forms a thin protective oxide layer on the wafer surface. Next, the silicon wafer 40 may be dipped in a second chemical solution to remove any native oxide that is formed on the surface of the silicon wafer 40. The second step also forms hydrogen passivation for the wafer. In some embodiments, the second chemical solution contains a mixture of hydrofluoric acid (HF) and water, where a mixing ratio of HF and water is about 1:10. The amount of time for the dipping lasts from about 10 seconds to about 20 seconds. The hydrogen passivation is removed when the silicon wafer 40 is heated under a hydrogen ambient before the epitaxial growth step discussed below.

After the cleaning process 50 is performed, the silicon wafer 40 is loaded into a growth chamber—for example, a metal oxide chemical vapor deposition (MOCVD) chamber—and then heated to a high temperature. In some embodiments, the high temperature is in a range from about 900 degrees Celsius to about 1150 degrees Celsius. In certain embodiments, this heating process is performed with the growth chamber being filled with a hydrogen ambient gas ($H_2$) for a period of time from about 5 minutes to about 10 minutes. As discussed above, a surface passivated layer (such as hydrogen passivation) may be removed as a result.

Figure 3:
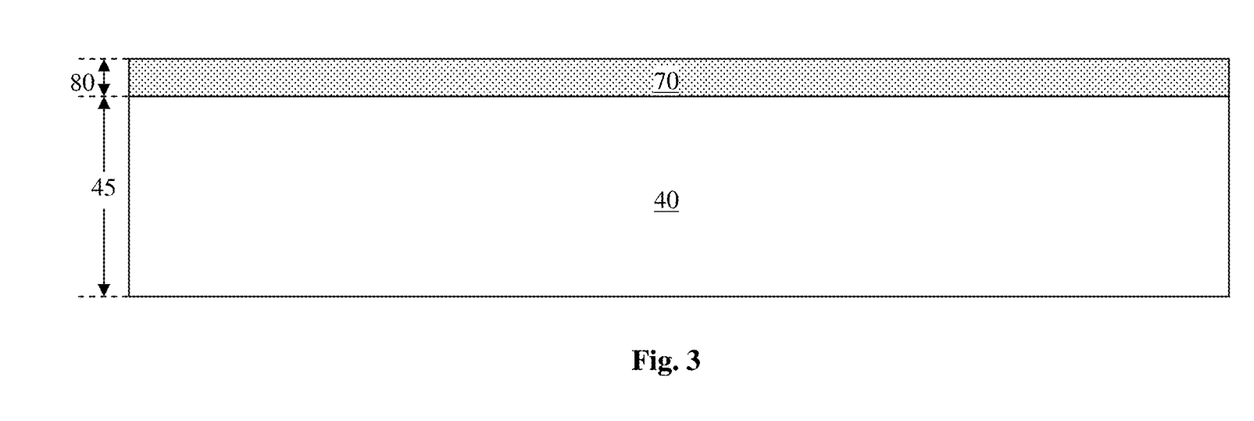

Referring now to FIG. 3, a buffer layer 70 is formed on the silicon wafer 40. In some embodiments, the buffer layer 70 includes an aluminum nitride (AlN) material. The buffer layer 70 has a thickness 80. In some embodiments, the thickness 80 is less than about 100 nanometers (nm), for example in a range from about 50 nm to about 100 nm. In some embodiments, the buffer layer 70 is formed by a MOCVD process, which may be performed at the same MOCVD chamber discussed above. In some embodiments, the MOCVD process is performed at a temperature in a range from about 800 degrees Celsius to about 1200 degrees Celsius, and for a process duration time in a range from about 0.5 hours to about 3 hours.

Figure 4:
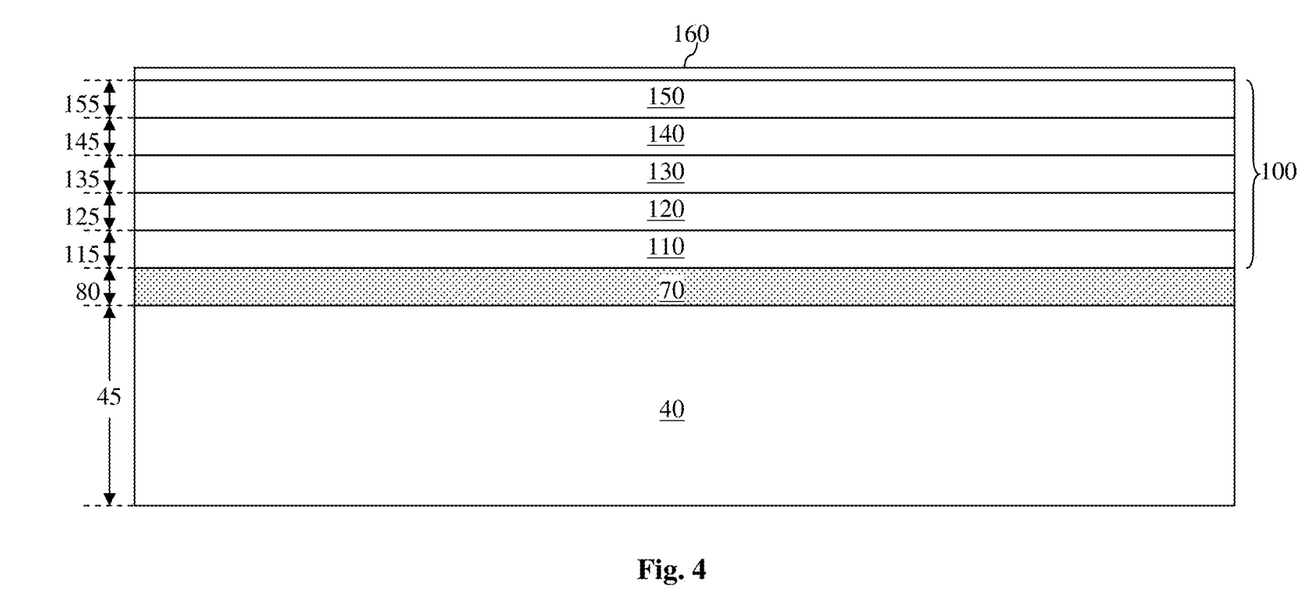

Referring now to FIG. 4, a buffer layer 100 is formed on the buffer layer 70. According to various aspects of the present disclosure, the buffer layer 100 has a step-graded aluminum composition. In more detail, in some embodiments, the buffer layer 100 includes a plurality of sub-layers, of which sub-layers 110, 120, 130, 140, and 150 are shown herein as examples. Each of the sub-layers 110-150 contains an aluminum gallium nitride (AlGaN) material. The sub-layer 110 located closest to the buffer layer 70 has the greatest aluminum content or concentration among all the sub-layers 110-150 (though the sub-layer 110 still has a lower aluminum content than the buffer layer 70). The aluminum content decreases for each sub-layer located further away from the buffer layer 70. In other words, each sub-layer has a lower aluminum content than the sub-layer located therebelow.

In some embodiments, the aluminum content for the buffer layer 70 is defined as 1; the aluminum content for the sub-layer layer 110 is in a range from about 0.7 to about 0.8; the aluminum content for the sub-layer layer 120 is in a range from about 0.5 to about 0.6; the aluminum content for the sub-layer layer 130 is in a range from about 0.38 to about 0.48; the aluminum content for the sub-layer layer 140 is in a range from about 0.29 to about 0.39; and the aluminum content for the sub-layer layer 150 is in a range from about 0.13 to about 0.23.

Alternatively stated, the sub-layers 110-150 each contain $Al_xGa_{1-x}N$, where "x" represents the aluminum content of each of the sub-layers 110-150, and where x is greater than or equal to about 0 but is less than or equal to about 1. Thus, the buffer layer 70 can be viewed as having an "x" value of 1, since it does not contain gallium, and the sub-layers 110-150 have value ranges for x that are between about 0.7-0.8, 0.5-0.6, 0.38-0.48, 0.29-0.39, and 0.13-0.23, respectively.

The step-wise decrease in terms of aluminum content of the sub-layers 110-150 allows the buffer layer 100 to be a good lattice buffer between the silicon wafer 40 (or the buffer layer 70) and a III-V compound layer (e.g., illustrated in FIG. 5 and discussed below) to be formed over the buffer layer 100. Since a lattice mismatch between a silicon material and a III-V compound material (such as gallium nitride) is large, it is not practical to grow the III-V compound layer directly on a silicon wafer. The buffer layer 70 contains aluminum and nitride and has a smaller thermal expansion coefficient misfit and better wetting (Lattice constant: GaN=3.160-3.190 A, AlN=3.11-3.112 A, Si=3.84 A. Thermal expansion coefficient: GaN=$5.59 \times 10^{-6}$ $K^1$, AlN=$4.15 \times 10^{-6}$ $K^1$, Si=$2.6 \times 10^{-6}$ $K^{-1}$) with silicon (compared to gallium nitride) to the extent that the buffer layer 70 can be directly grown on the silicon wafer 40. However, even though the buffer layer 70 contains nitride (as does the III-V compound layer in the embodiments discussed herein), the lattice mismatch, thermal expansion coefficient misfit and wetting between the buffer layer 70 and the III-V compound layer are still significant. As such, the epitaxial growth of the III-V compound layer directly on the buffer layer 70 may still be difficult and/or may lead to low quality growth.

The buffer layer 100 serves as another lattice buffer between the buffer layer 70 and the III-V compound layer. Since the sub-layers 110-150 of the buffer layer 100 each contain aluminum and gallium, the lattice constants of the sub-layers 110-150 are somewhere in between the lattice constant of the buffer layer 70 (which contains aluminum) and the lattice constant of the III-V compound layer (which contains gallium in the embodiments discussed herein).

In addition, the step-wise graded characteristic of the aluminum content of each sub-layer as a function of its relative location means that each sub-layer has a relatively small lattice mismatch with the layers above and below. For example, the buffer layer 70 has an aluminum content of about 1, and the sub-layer 110 has an aluminum content of about 0.7-0.8. Therefore, the lattice constant mismatch between the buffer layer 70 and the sub-layer 110 is not significant due to the relatively small difference in their respective aluminum content. As another example, the sub-layer 140 has an aluminum content of about 0.29-0.39, and the sub-layer 150 has an aluminum content of about 0.13-0.23. Therefore, the lattice constant mismatch between the sub-layers 140 and 150 is also small due to the relatively minor difference in their respective aluminum content. In effect, the step-wise graded aluminum content of the sub-layers 110-150 allows for a "smoother" transition of lattice constants, such that no layer or sub-layer will come into contact with another layer having a drastically different lattice constant.

In some embodiments, the sub-layers 110-150 are each formed using an epitaxial growth process that takes place in an MOCVD chamber, for example the same chamber that is used to grow the buffer layer 70. If process simplicity is desired, the epitaxial growth processes used to grow the sub-layers 110-150 of the buffer layer 100 can all be performed at substantially similar temperatures. In some embodiments, the epitaxial process temperatures for growing the sub-layers 110-150 are in a range from about 800 degrees Celsius to about 1200 degrees Celsius.

The aluminum content can be controlled by carefully releasing a predetermined number of moles of aluminum into the epitaxial growth process chamber. Thus, while each sub-layer is being grown, the number of moles of aluminum is held as a constant, so as to ensure that each given sub-layer has a fixed aluminum content. When it is time to grow a new sub-layer, the only change that needs to be made is the number of moles of aluminum released into the epitaxial growth process chamber. In accordance with the various aspects of the present disclosure, the number of moles of aluminum released into the chamber is reduced each time a new sub-layer is about to be formed.

The sub-layers 110, 120, 130, 140, and 150 are formed to have predetermined levels of thicknesses 115, 125, 135, 145, and 155, respectively. The bottom sub-layer 110 (closest to the buffer layer 70) has the smallest thickness 115, which is less than about 100 nm according to some embodiments. This is because the sub-layer 110 has the highest aluminum content out of all the sub-layers of the buffer layer 100. If the sub-layer 110 is formed too thick, the high aluminum content may lead to cracking and high defect density issues. The thicknesses 125, 135, 145, and 155 are greater than the thickness 115. According to some embodiments, the thicknesses 125, 135, 145, and 155 are greater than about 100 nm but are less than about 150 nm. The thicknesses 125-155 can be thicker (e.g., thicker than the thickness 115) because the aluminum content for their respective sub-layer is smaller. Nevertheless, the thicknesses 125-155 cannot be too thick because that would create undue stress. In addition, a thickness exceeding about 155 nm may lead to poor crystal quality.

Although the embodiments discussed herein involve forming five sub-layers 110-150 for the buffer layer 100, any other number of multiple sub-layers may be used to form the buffer layer 100 in alternative embodiments. For example, one embodiment may involve forming four sub-layers of AlGaN, while other embodiments may involve forming ten sub-layers of AlGaN. In certain alternative embodiments, the buffer layer 100 may actually include only one AlGaN layer. The AlGaN layer may have an aluminum content that is between about 0.65 to about 0.85, and a thickness in a range from about 50 nm to about 100 nm. In addition, the material composition of the buffer layer 100 is not necessarily limited to AlGaN. Other suitable compounds may be utilized in various other embodiments to reduce the lattice mismatch between a silicon wafer and the III-V compound layer to be formed thereon.

In some embodiments, after the last (i.e., the upper-most) sub-layer 150 of the buffer layer 100 is formed, the aluminum source is shut off, but whatever remaining amount of aluminum remaining in the pipes may still permeate into the epitaxial growth chamber, thereby forming a very thin AlGaN buffer layer 160. In some embodiments, the thin AlGaN buffer layer 160 is thinner than about 20 nm and has an aluminum content that is less than about 0.05. Due to the low aluminum concentration, the AlGaN buffer layer 160 provides further buffering of mismatched lattice constants. The AlGaN buffer layer 160 may also be considered a part of the buffer layer 100.

Figure 5:
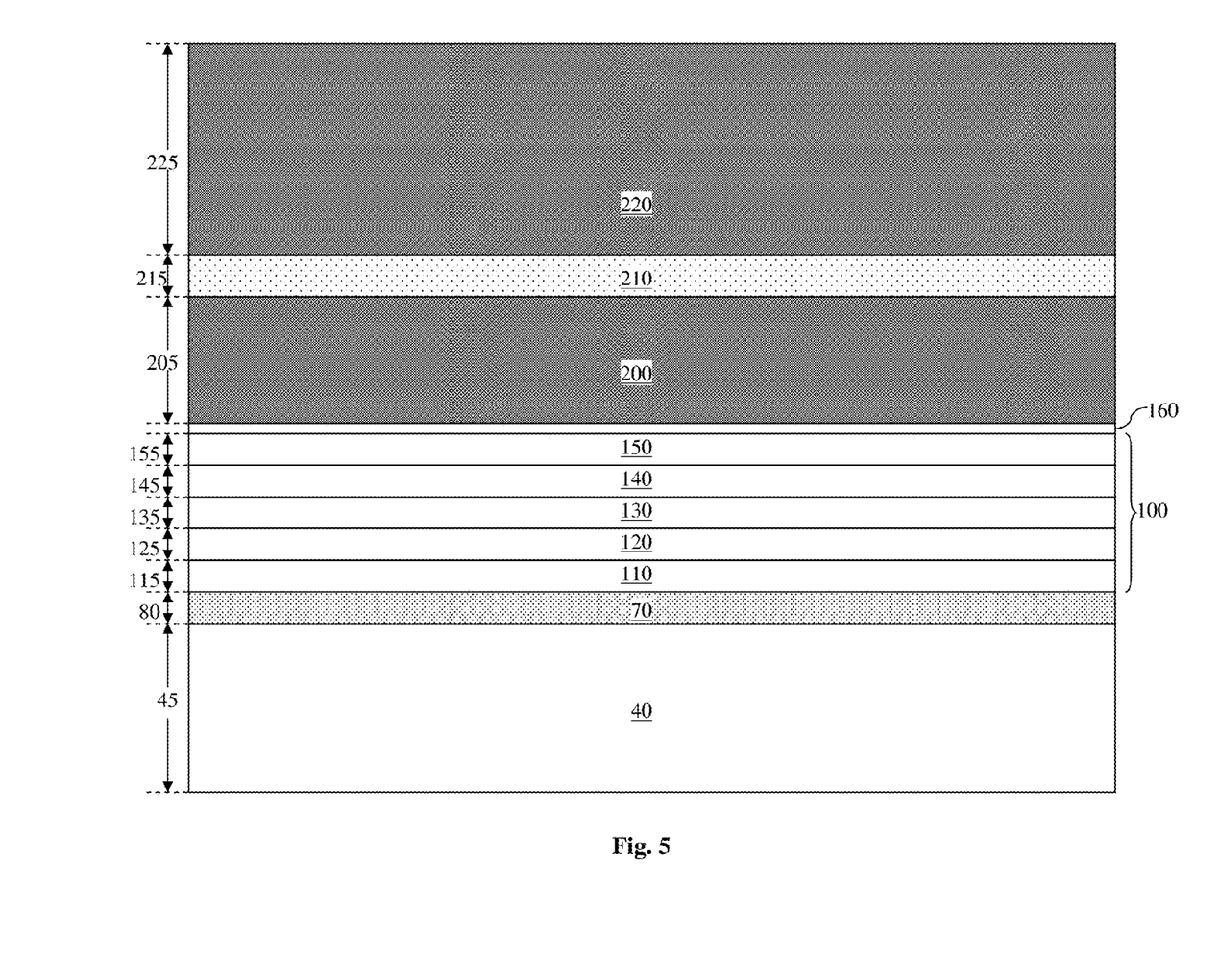

Referring now to FIG. 5, a III-V compound layer 200 (also referred to as a III-V compound bulk layer) is formed over the buffer layer 100 (or over the AlGaN buffer layer 160 in embodiments where the AlGaN buffer layer 160 is formed). The III-V compound layer 200 is formed by an epitaxial growth process, which can be performed using the same epitaxial growth chamber used to grow the buffer layer 100. The epitaxial growth process temperature may be in a range from about 1000 degrees Celsius to about 1200 degrees Celsius. In some embodiments, the III-V compound layer 200 includes a gallium nitride material. As discussed above, since the buffer layer 100 has a step-wise graded aluminum content pattern, the layer (whether it is the sub-layer 150 or the AlGaN buffer layer 160) that comes into contact with the III-V compound layer 200 will have a relatively small lattice constant mismatch with the III-V compound layer 200. As such, the III-V compound layer 200 can be grown easily and with high quality (e.g., higher quality crystal structure).

The III-V compound layer 200 has a thickness 205. Due to stress related reasons, and since the III-V compound layer 200 is the first III-V compound layer that is grown, it may be desirable not to make it too thick. In some embodiments, the thickness 205 is in a range from about 0.2 um to about 0.5 um. Another thicker III-V compound layer is grown over the III-V compound layer 200, as discussed below.

Before the other III-V compound layer is grown, a stress buffer layer 210 is formed on the III-V compound layer 200. The stress buffer layer 210 is also formed using an epitaxial growth process, which may be performed at a process temperature less than or equal to about 1200 degrees Celsius. In some embodiments, the stress buffer layer 210 contains AlN and has a thickness 215 in a range from about 5 nm to about 20 nm. In other embodiments, the stress buffer layer 210 contains a $Al_xGa_{1-x}N$/GaN supper lattice (SL) material and has a thickness 215 less than about 100 nm.

A thicker III-V compound layer 220 (also referred to as a III-V compound bulk layer) is then formed on the stress buffer layer 210. The III-V compound layer 220 is formed by an epitaxial growth process, which can be performed using the same epitaxial growth chamber used to grow the previous layers discussed above. The epitaxial growth process temperature may be less than about 1200 degrees Celsius. In some embodiments, the III-V compound layer 200 includes a gallium nitride material. The III-V compound layer 220 has a thickness 225. In some embodiments, the thickness 225 is greater than about 1.5 um. Due at least in part to the fact that the intermediate III-V compound layer 200 has already been grown over the silicon wafer 40, the III-V compound layer 220 can be grown with a higher quality (e.g., higher crystal structure quality than the layer 200) since it is grown over the III-V compound layer 200 having the same material composition and lattice structure. The III-V compound layer 220 can also be grown to be quite thick, as the stress buffer layer 210 helps relieve stress.

Figure 6:
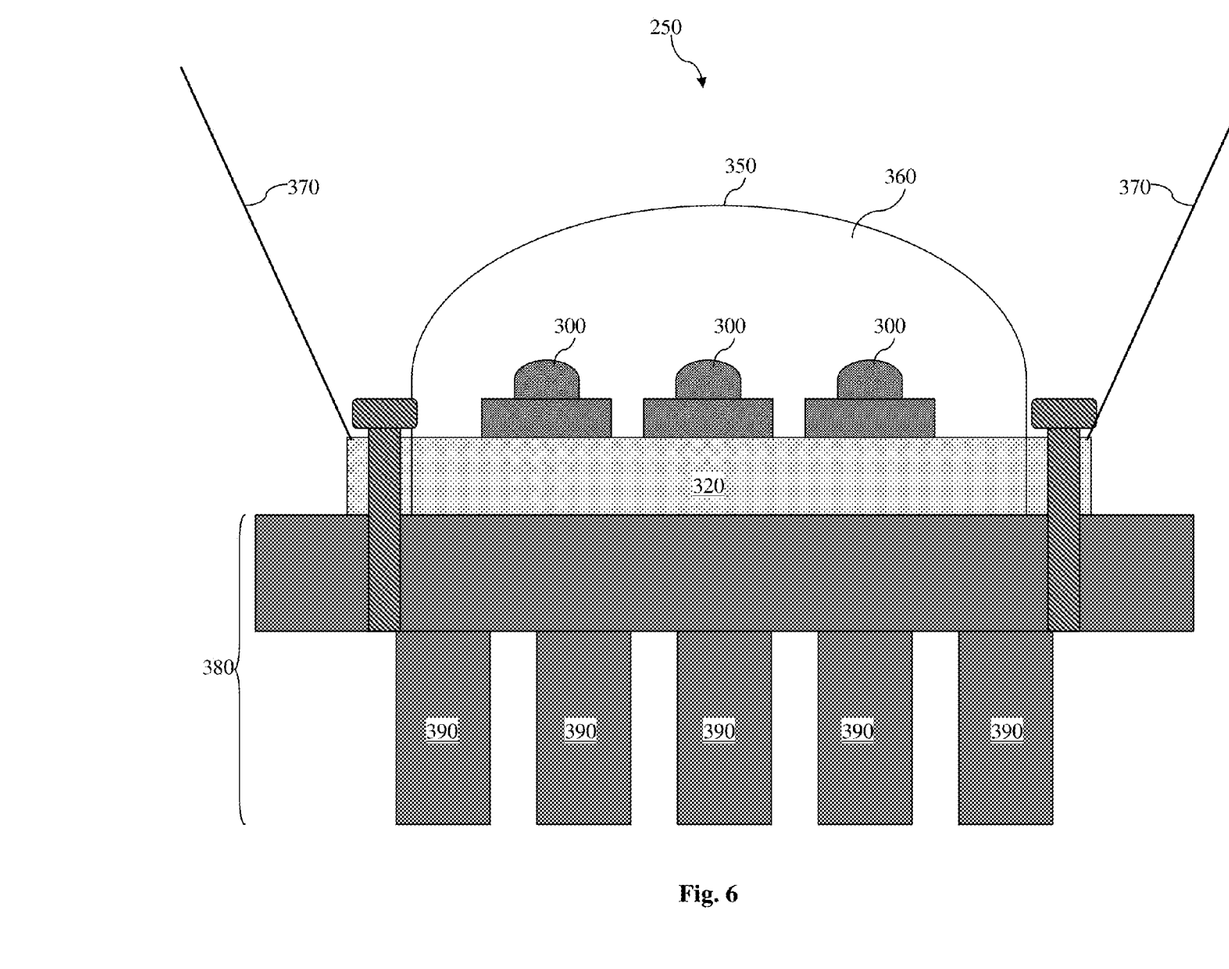
FIG. 6 is a diagrammatic fragmentary cross-sectional side view of an example LED lighting apparatus according to various aspects of the present disclosure.

A variety of microelectronic devices can be fabricated using the III-V compound layer 220. For example, the fabrication of LED devices typically employs a III-V compound layer. Referring to FIG. 6, a diagrammatic fragmentary cross-sectional side view of a portion of an LED-based lighting instrument 250 is illustrated according to some embodiments of the present disclosure. The lighting instrument 250 includes a plurality of LED dies 300 as light sources.

The LED dies 300 each include two doped semiconductor layers having different types of conductivity. According to various aspects of the present disclosure, these doped semiconductor layers may be the III-V compound layer 220 as discussed above, or may be formed using similar processes discussed above. The LED dies 300 also each include a multiple-quantum well (MQW) layer that is disposed in between these III-V compound layers. The MQW layer includes alternating (or periodic) layers of active material, such as gallium nitride and indium gallium nitride (InGaN). For example, the MQW layer may include a number of gallium nitride layers and a number of indium gallium nitride layers, wherein the gallium nitride layers and the indium gallium nitride layers are formed in an alternating or periodic manner. In some embodiments, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency depends on the number of layers of alternating layers and thicknesses.

When an electrical voltage (or electrical charge) is applied to the doped layers of the LED, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer.

It is understood that each LED die may also include a pre-strained layer and an electron-blocking layer. The pre-strained layer may be doped and may serve to release strain and reduce a Quantum-Confined Stark Effect (QCSE)—describing the effect of an external electric field upon the light absorption spectrum of a quantum well—in the MQW layer. The electron blocking layer may include a doped aluminum gallium nitride (AlGaN) material, wherein the dopant may include Magnesium. The electron blocking layer helps confine electron-hole carrier recombination to within the MQW layer, which may improve the quantum efficiency of the MQW layer and reduce radiation in undesired bandwidths.

In some embodiments, the LED dies 300 each have a phosphor layer coated thereon. The phosphor layer may include either phosphorescent materials and/or fluorescent materials. The phosphor layer may be coated on the surfaces of the LED dies 300 in a concentrated viscous fluid medium (e.g., liquid glue). As the viscous liquid sets or cures, the phosphor material becomes a part of the LED package. In practical LED applications, the phosphor layer may be used to transform the color of the light emitted by an LED dies 300. For example, the phosphor layer can transform a blue light emitted by an LED die 300 into a different wavelength light. By changing the material composition of the phosphor layer, the desired light color emitted by the LED die 300 may be achieved.

The LED dies 300 are mounted on a substrate 320. In some embodiments, the substrate 320 includes a Metal Core Printed Circuit Board (MCPCB). The MCPCB includes a metal base that may be made of aluminum (or an alloy thereof). The MCPCB also includes a thermally conductive but electrically insulating dielectric layer disposed on the metal base. The MCPCB may also include a thin metal layer made of copper that is disposed on the dielectric layer. In alternative embodiments, the substrate 320 may include other suitable thermally conductive structures. The substrate 320 may or may not contain active circuitry and may also be used to establish interconnections.

The lighting instrument 250 includes a diffuser cap 350. The diffuser cap 350 provides a cover for the LED dies 300 therebelow. Stated differently, the LED dies 300 are encapsulated by the diffuser cap 350 and the substrate 320 collectively. In some embodiments, the diffuser cap 350 has a curved surface or profile. In some embodiments, the curved surface may substantially follow the contours of a semicircle, so that each beam of light emitted by the LED dies 300 may reach the surface of the diffuser cap 350 at a substantially right incident angle, for example, within a few degrees of 90 degrees. The curved shape of the diffuser cap 350 helps reduce Total Internal Reflection (TIR) of the light emitted by the LED dies 300.

The diffuser cap 350 may have a textured surface. For example, the textured surface may be roughened, or may contain a plurality of small patterns such as polygons or circles. Such textured surface helps scatter the light emitted by the LED dies 300 so as to make the light distribution more uniform. In some embodiments, the diffuser cap 350 is coated with a diffuser layer containing diffuser particles.

In some embodiments, a space 360 between the LED dies 300 and the diffuser cap 350 is filled by air. In other embodiments, the spacer 360 may be filled by an optical-grade silicone-based adhesive material, also referred to as an optical gel. Phosphor particles may be mixed within the optical gel in that embodiment so as to further diffuse light emitted by the LED dies 300.

Though the illustrated embodiment shows all of the LED dies 300 being encapsulated within a single diffuser cap 350, it is understood that a plurality of diffuser caps may be used in other embodiments. For example, each of the LED dies 300 may be encapsulated within a respective one of the plurality of diffuser caps.

The lighting instrument 250 includes a reflective structure 370. The reflective structure 370 may be mounted on the substrate 320. In some embodiments, the reflective structure is shaped like a cup, and thus it may also be referred to as a reflector cup. The reflective structure encircles or surrounds the LED dies 300 and the diffuser cap 350 in 360 degrees from a top view. From the top view, the reflective structure 370 may have a circular profile, a beehive-like hexagonal profile, or another suitable cellular profile encircling the diffuser cap 350. In some embodiments, the LED dies 300 and the diffuser cap 350 are situated near a bottom portion of the reflective structure 370. Alternatively stated, the top or upper opening of the reflective structure 370 is located above or over the LED dies 300 and the diffuser cap 350.

The reflective structure 370 is operable to reflect light that propagates out of the diffuser cap 350. In some embodiments, the inner surface of reflective structure 370 is coated with a reflective film, such as aluminum, silver, or alloys thereof. It is understood that the surface of the sidewalls of the reflective structure 370 may be textured in some embodiments, in a manner similar to the textured surface of the diffuser cap 350. Hence, the reflective structure 370 is operable to perform further scattering of the light emitted by the LED dies 300, which reduces glare of the light output of the lighting instrument 250 and makes the light output friendlier to the human eye. In some embodiments, the sidewalls of the reflective structure 370 have a sloped or tapered profile. The tapered profile of the reflective structure 370 enhances the light reflection efficiency of the reflective structure 370.

The lighting instrument 250 includes a thermal dissipation structure 380, also referred to as a heat sink 380. The heat sink 380 is thermally coupled to the LED dies 300 (which generate heat during operation) through the substrate 320. In other words, the heat sink 380 is attached to the substrate 320, or the substrate 320 is located on a surface of the heat sink 200. The heat sink 380 is configured to facilitate heat dissipation to the ambient atmosphere. The heat sink 380 contains a thermally conductive material, such as a metal material. The shape and geometries of the heat sink 380 are designed to provide a framework for a familiar light bulb while at the same time spreading or directing heat away from the LED dies 300. To enhance heat transfer, the heat sink 380 may have a plurality of fins 390 that protrude outwardly from a body of the heat sink 380. The fins 390 may have substantial surface area exposed to ambient atmosphere to facilitate heat transfer.

Figure 7:
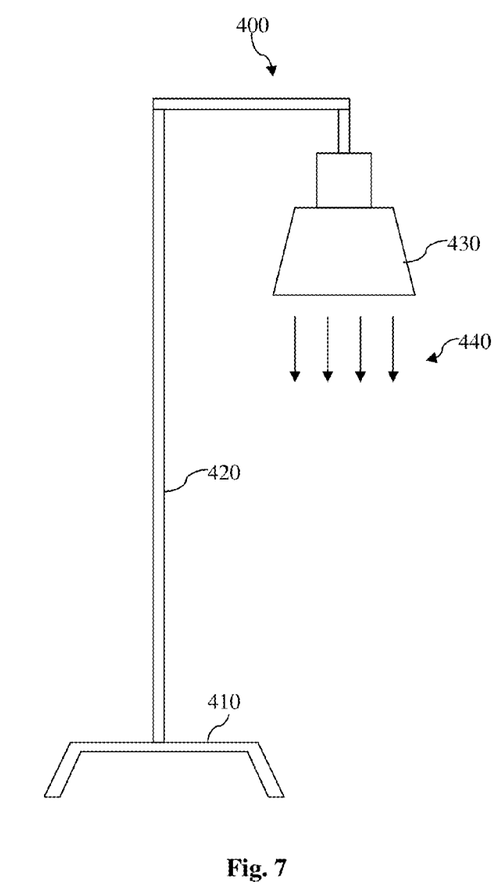
FIG. 7 is a diagrammatic view of a lighting module that includes the LED lighting apparatus of FIG. 6 according to various aspects of the present disclosure.

FIG. 7 illustrates a simplified diagrammatic view of a lighting module 400 that includes some embodiments of the lighting instrument 250 discussed above. The lighting module 400 has a base 410, a body 420 attached to the base 410, and a lamp 430 attached to the body 420. In some embodiments, the lamp 430 is a down lamp (or a down light lighting module). The lamp 430 includes the lighting instrument 250 discussed above with reference to FIG. 6. The lamp 430 is operable to efficiently project light beams 440. In addition, the lamp 430 can offer greater durability and longer lifetime compared to traditional incandescent lamps.

Of course, the LED devices discussed above are merely an example of how the high quality III-V compound layers formed according to various aspects of the present disclosure may be used. As other examples, the high quality III-V compound layers may be used to fabricate radio frequency (RF) devices, high electron mobility transistor (HEMT) devices, high power semiconductor devices, or other suitable microelectronic devices.

The growth of the III-V compound layer according to the embodiments disclosed herein offers advantages over existing methods. It is understood, however, that not all advantages are necessarily discussed herein, and different embodiments may offer additional advantages, and that no particular advantage is required for all embodiments.

One advantage is that through the use of the buffer layer with the step-wise graded aluminum content, the lattice constant mismatch at any point of the semiconductor structure is not too large. Therefore, a high quality III-V compound layer can be grown on a silicon wafer. For example, in certain embodiments, the defect density can be reduced to about $10E8/centimeter^2$. Since the step graded buffer layer includes a plurality of thin sub-layers, the overall thickness of the buffer layer can be large enough so as to sufficiently relieve the stress between the silicon wafer and the III-V compound layer. The III-V compound layer can also be grown to be thick (e.g., >2 um). Another advantage is the various layers discussed above may be grown in the same epitaxial chamber, therefore reducing process complexity and saving fabrication costs.

One of the broader forms of the present disclosure involves an apparatus. The apparatus includes a semiconductor structure that includes: a silicon substrate; a first buffer layer disposed over the silicon substrate, wherein the first buffer layer contains a III-V compound that includes a first group III element and a group V element; a second buffer layer disposed over the first buffer layer, wherein the second buffer layer includes a plurality of sub-layers that each contain the first group III element, the group V element, and a second group III element, and wherein a content of the first group III element decreases for each sub-layer that is located further away from the first buffer layer; and a III-V compound bulk layer disposed over the second buffer layer.

In some embodiments, the first group III element is aluminum, and wherein each of the sub-layers has a fixed aluminum content that is different from that of the other sub-layers.

In some embodiments, the first buffer layer contains aluminum nitride (AlN); the sub-layers of the second buffer layer each contain aluminum gallium nitride ($Al_xGa_{1-x}N$), wherein $0<x<1$; and the III-V compound bulk layer contains gallium nitride (GaN).

In some embodiments, the III-V compound bulk layer is a first III-V compound bulk layer, and wherein the semiconductor structure further comprises: a third buffer layer disposed over the first III-V compound bulk layer; and a second III-V compound bulk layer disposed over the third buffer layer.

In some embodiments, the third buffer layer contains AlN or $Al_xGa_{1-x}N$/GaN; and the first III-V compound bulk layer and the second III-V compound bulk layer each contain GaN.

In some embodiments, the second III-V compound bulk layer is substantially thicker and has a better quality crystal structure than the first III-V compound bulk layer.

In some embodiments, the first buffer layer has a thickness less than about 100 nanometers (nm); the sub-layers of the second buffer layer each have a thickness less than about 150 nm; the first III-V compound layer has a thickness in a range from about 0.2 microns to about 0.5 microns; the third buffer layer has a thickness less than about 100 nm; and the second III-V compound layer has a thickness greater than about 1.5 microns.

In some embodiments, a sub-layer disposed closest to the first buffer layer has a thickness less than about 100 nm, while the rest of the sub-layers each have a thickness greater than about 100 nm but less than about 150 nm.

In some embodiments, the semiconductor structure is a part of a light-emitting diode (LED), a radio frequency (RF) device, a high electron mobility transistor (HEMT) device, or a high power semiconductor device.

In some embodiments, the apparatus further comprises a lighting module in which the LED is implemented.

Another one of the broader forms of the present disclosure involves a semiconductor device. The semiconductor device includes: a silicon substrate; an aluminum nitride (AlN) buffer layer located on the silicon substrate; a composite buffer layer located on the AlN buffer layer, the composite buffer layer including a plurality of aluminum gallium nitride ($Al_xGa_{1-x}N$) sub-layers, wherein each of the sub-layers has a respective value for x that is between 0 and 1, and wherein x for a given sub-layer is no greater than x of other sub-layers disposed between the given sub-layer and the AlN buffer layer; and a first III-V bulk layer located over the composite buffer layer.

In some embodiments, the semiconductor device further includes: an insertion layer disposed on the first III-V bulk layer; and a second III-V bulk layer located on the insertion layer.

In some embodiments, the first III-V bulk layer and the second III-V bulk layer each contain gallium nitride (GaN); and the insertion layer contains AlN or $Al_xGa_{1-x}N$/GaN.

In some embodiments, the first III-V bulk layer has a thickness being in a range from about 0.2 microns to about 0.5 microns; the insertion layer has a thickness less than about 100 nanometers; and the first III-V bulk layer has a thickness greater than about 1.5 microns.

In some embodiments, the AlN buffer layer has a thickness less than about 100 nanometers (nm); the sub-layer located closest to the AlN buffer layer has a thickness less than about 100 nm; and the rest of the sub-layers each have a thickness in a range from about 100 nm to about 150 nm.

Yet another one of the broader forms of the present disclosure involves a method of fabricating a semiconductor device. The method includes: cleaning a silicon wafer; epitaxially growing a first buffer layer on the silicon wafer, the first buffer layer containing an aluminum nitride (AlN) material; epitaxially growing a second buffer layer on the first buffer layer, the second buffer layer including a plurality of aluminum gallium nitride ($Al_xGa_{1-x}N$) sub-layers, wherein each of the sub-layers has a respective value for x that is between 0 and 1, and wherein a value of x for each sub-layer is a function of its position within the second buffer layer; epitaxially growing a first gallium nitride (GaN) layer over the second buffer layer; epitaxially growing a third buffer layer over the first GaN layer; and epitaxially growing a second GaN layer over the third buffer layer.

In some embodiments, the value of x for a sub-layer located closer to the first buffer layer is greater than or equal to the value of x for a sub-layer located farther away from the first buffer layer.

In some embodiments, the cleaning the silicon wafer comprises boiling the silicon wafer in a mixture of sulfuric acid and hydrogen peroxide and thereafter immersing the silicon wafer in hydrofluoric acid; and all the epitaxially growing steps are performed using a same epitaxial growth process chamber.

In some embodiments, the first buffer layer has a thickness that is less than about 100 nanometers (nm); a sub-layer that is formed closest to the first buffer layer has a thickness that is less than about 100 nm; the remaining sub-layers each have a thickness in a range between about 100 nm and about 150 nm; the first GaN layer has a thickness that is in a range from about 0.2 microns to about 0.5 microns; the third buffer layer has a thickness that is less than about 100 nm; and the second GaN layer has a thickness that is greater than about 1.5 microns.

In some embodiments, the method further includes: fabricating an electronic device using the second GaN layer, wherein the electronic device includes one of: a light-emitting diode (LED), a radio frequency (RF) device, a high electron mobility transistor (HEMT) device, and a high power semiconductor device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
    a semiconductor structure that includes:
        a silicon substrate;
        a first buffer layer disposed over the silicon substrate, wherein the first buffer layer contains a III-V compound that includes a first group III element and a group V element;
        a second buffer layer disposed over the first buffer layer, wherein the second buffer layer includes a plurality of sub-layers that each contain the first group III element, the group V element, and a second group III element, and wherein a content of the first group III element decreases for each sub-layer that is located further away from the first buffer layer, and wherein the content of the first group III element is fixed within each sub-layer but is different from that of the other sub-layers;
        a first III-V compound bulk layer disposed over the second buffer layer;
        a third buffer layer disposed over the first III-V compound bulk layer;
        a fourth buffer layer disposed between the second buffer layer and the first III-V compound bulk layer, wherein the fourth buffer layer is thinner than each of the first buffer layer, the first III-V compound bulk layer, and each of the sub-layers of the second buffer layer, and wherein the fourth buffer layer has a lower aluminum content than each of the sub-layers of the second buffer layer; and
        a second III-V compound bulk layer disposed over the third buffer layer, wherein the second III-V compound bulk layer is substantially thicker than the first III-V compound bulk layer.

2. The apparatus of claim 1, wherein the first group III element is aluminum.

3. The apparatus of claim 1, wherein:
    the first buffer layer contains aluminum nitride (AlN);
    the sub-layers of the second buffer layer each contain aluminum gallium nitride ($Al_xGa_{1-x}N$), wherein $0<x<1$; and the first III-V compound bulk layer contains gallium nitride (GaN).

4. The apparatus of claim 1, wherein:
the third buffer layer contains AlN or $Al_xGa_{1-x}N/GaN$; and
the first III-V compound bulk layer and the second III-V compound bulk layer each contain GaN.

5. The apparatus of claim 1, wherein:
the first buffer layer has a thickness less than about 100 nanometers (nm);
the sub-layers of the second buffer layer each have a thickness less than about 150 nm;
the first III-V compound layer has a thickness in a range from about 0.2 microns to about 0.5 microns;
the third buffer layer has a thickness less than about 100 nm; and
the second III-V compound layer has a thickness greater than about 1.5 microns.

6. The apparatus of claim 5, wherein a sub-layer disposed closest to the first buffer layer has a thickness less than about 100 nm, while the rest of the sub-layers each have a thickness greater than about 100 nm but less than about 150 nm.

7. The apparatus of claim 1, wherein the semiconductor structure is a part of a light-emitting diode (LED), a radio frequency (RF) device, a high electron mobility transistor (HEMT) device, or a high power semiconductor device.

8. The apparatus of claim 7, wherein the apparatus further comprises a lighting module in which the LED is implemented.

9. A semiconductor apparatus, comprising:
a silicon substrate;
an aluminum nitride (AlN) buffer layer located on the silicon substrate;
a composite buffer layer located on the AlN buffer layer, the composite buffer layer including at least three aluminum gallium nitride ($Al_xGa_{1-x}N$) sub-layers in a stacked arrangement such that a top surface of a lower sub-layer directly contacts a bottom surface of an upper sub-layer, wherein each of the sub-layers has a respective value for x that is between 0 and 1, and wherein x of a given sub-layer is smaller than x of an adjacent below sub-layer;
a first III-V bulk layer located over the composite buffer layer;
an insertion layer disposed on the first III-V bulk layer; and
a second III-V bulk layer located on the insertion layer, wherein the second III-V bulk layer is substantially thicker than the first III-V bulk layer, wherein the first and second III-V bulk layers contain a material that is other than aluminum gallium nitride,
wherein the plurality of the $Al_xGa_{1-x}N$ sub-layers have different thicknesses that are associated with their respective Al concentration, and wherein the Al concentration remains constant within each of the $Al_xGa_{1-x}N$ sub-layers.

10. The semiconductor apparatus of claim 9, wherein:
the first III-V bulk layer and the second III-V bulk layer each contain gallium nitride (GaN); and
the insertion layer contains AlN or $Al_xGa_{1-x}N/GaN$.

11. The semiconductor apparatus of claim 9, wherein:
the first III-V bulk layer has a thickness being in a range from about 0.2 microns to about 0.5 microns;
the insertion layer has a thickness less than about 100 nanometers; and
the second III-V bulk layer has a thickness greater than about 1.5 microns.

12. The semiconductor apparatus of claim 9, wherein:
the AlN buffer layer has a thickness less than about 100 nanometers (nm);
the sub-layer located closest to the AlN buffer layer has a thickness less than about 100 nm; and
the rest of the sub-layers each have a thickness in a range from about 100 nm to about 150 nm.

13. The apparatus of claim 1, wherein the second III-V compound bulk layer is at least three times thicker than the first III-V compound bulk layer.

14. The apparatus of claim 1, wherein the first and second buffer layers have different thicknesses that are associated with their respective concentration of the first group III element.

15. The apparatus of claim 3, wherein a sub-layer that is in the plurality of sub-layers and disposed closest to the first buffer layer has a smallest thickness less than that of each of the rest of the sub-layers.

16. The apparatus of claim 9, wherein a sub-layer that is in the plurality of sub-layers and disposed closest to the AlN buffer layer has a smallest thickness less than that of each of the rest of the sub-layers.

* * * * *